United States Patent [19]
Burt et al.

[11] 3,934,060
[45] Jan. 20, 1976

[54] METHOD FOR FORMING A DEPOSITED SILICON DIOXIDE LAYER ON A SEMICONDUCTOR WAFER

[75] Inventors: Dan L. Burt; Richard F. Taraci, both of Phoenix; John E. Zavion, Mesa, all of Ariz.

[73] Assignee: Motorola, Inc., Chicago, Ill.

[22] Filed: Dec. 19, 1973

[21] Appl. No.: 426,395

[52] U.S. Cl. .................. 427/95; 118/48; 118/49; 118/49.1; 118/49.5; 427/248; 427/294; 427/299
[51] Int. Cl.² .................................. C23C 11/08
[58] Field of Search ............ 117/106 A, 106 R, 201, 117/213, 61; 118/48, 49, 49.1, 49.5; 427/248, 95, 294, 299

[56] References Cited
UNITED STATES PATENTS

| | | | |
|---|---|---|---|
| 3,408,224 | 10/1968 | Ashburn et al. | 118/49 X |
| 3,409,483 | 11/1968 | Watson | 117/201 X |
| 3,445,280 | 5/1969 | Tokuyama et al. | 117/106 R X |
| 3,755,890 | 9/1973 | Klehm | 117/61 X |

FOREIGN PATENTS OR APPLICATIONS 36-7608   6/1961   Japan

OTHER PUBLICATIONS

Perrault et al., "Coating Process," IBM Technical Disclosure Bulletin, Vol. 16, No. 3, Aug. 1973, p. 726.

*Primary Examiner*—Harris A. Pitlick
*Attorney, Agent, or Firm*—Harry M. Weiss; Ellen P. Trevors

[57] ABSTRACT

The present invention is directed to a method for forming a thin silicon dioxide deposited layer on a semiconductor structure. The silicon dioxide layer is formed in a hot wall furnace typically used for diffusions. A convenient temperature is selected from those which are suitable for decomposing the TEOS source of the silicon dioxide into its constituent parts out of which the silicon dioxide layer is formed. A vacuum is used to pull the TEOS gas through the diffusion tube. Care is exercised to assure that the flow of the TEOS material through the diffusion tube is kept at a constant rate. Prior to the first use of a new TEOS source bottle, the bottle is placed in a vacuum at least low enough to complete the boiling of impurities from the source material. This predeposition vacuum step is calculated to remove all the impurities contained in the source bottle and caused by the in situ decomposition of the source material during transit and storage. Whenever the source material is allowed to stand for any period of time; i.e., overnight or any number of hours, the predeposition vacuum step removes those impurities formed during the in situ decomposition of the source material since its last use.

Wafers to be coated with a deposited oxide layer are placed in a furnace boat perpendicular to the flow of the source gas. In the preferred embodiment, the wafers are spaced 200 mils apart. While there is no indentified maximum distance between wafers at which the present invention ceases to operate successfully, undesirable results occur by placing adjacent wafers closer than 100 mils while acceptable results are achieved by placing the wafers 100–200 mils apart.

6 Claims, 5 Drawing Figures

METHOD FOR FORMING A DEPOSITED SILICON DIOXIDE LAYER ON A SEMICONDUCTOR WAFER

BACKGROUND OF THE INVENTION

The use of tetraethylorthosilicate (TEOS) as the source of a deposited oxide is well known. Such material can be used to form a deposited oxide layer at a relatively low temperature so as not to disturb the diffusions previously made into the wafer. It is well known that a thermal oxide is much denser than a deposited oxide. However, a thermal oxide is formed at a higher temperature at which the previously made diffusions will move deeper into the semiconductor wafer. Accordingly, there is a need for forming a deposited oxide layer at a lower temperature on a semiconductor wafer itself or on such a wafer completely or partially covered with thermal oxide. It is also known that a subsequent annealing step will densify the deposited oxide layer.

The prior art process for forming deposited oxides using TEOS used nitrogen as the carrier gas. This nitrogen gas is passed over the TEOS as it resets in a source container, or the carrier gas is bubbled through the TEOS held in the source container.

The decomposition temperature of TEOS is well known and lies within a range having as its upper usable temperature, a temperature of 960°C. As the temperature is reduced, the decomposition rate, as well as the vaporization rate, is reduced until a point at which the chemical reaction stops or the chemical reaction is carried on so slowly that it appears to stop. The use of a particular temperature can be selected by a man skilled in the art for both the prior art process as well as the process of the invention.

In the use of the prior art process, the wafers to be covered with a deposited oxide film are laid broadside down in a furnace boat. The difficulties of obtaining acceptable results require that the wafers be placed in a line extending from the source input end of the furnace tube to the source output end of the furnace tube and lying directly in the path of the movement of the source gas. These constraints are required to achieve something of a uniform thickness of deposited oxide over a significant portion of the wafer surface. In practice, it has been found that seven to ten wafers can be placed in such a line and that the deposited oxide will be formed on such wafers in a stripe covering less than the entire surface of the wafers.

Wafers processed according to the above-described steps do not always result in layers having acceptable characteristics. One such characteristic which has been a source of defects in semiconductor devices subsequently made in such wafers is the presence of impurities in the film. Such impurities result in a film which is insufficiently dense or which cause differences in the electrical characteristics between devices fabricated on such a wafer.

In the design and fabrication of semiconductor devices, a predetermined thickness of a deposited oxide layer is required. This required thickness has established upper and lower limits for producing a minimum number of workable devices. In the prior art, the target thickness is identified at 1500 Angstroms and the variation can be ± 500 Angstroms. With this as a goal to work towards, it is important to note that in the use of the prior art process, not only was the deposited oxide formed on the wafers over a stripe which is less than the total surface area of the wafer, but the variation in thickness from side to side perpendicular to the gas flow can be as high as 500-2000 Angstroms. The variation from one edge to the opposite edge parallel to the gas flow is less than that achieved side to side and usually the difference in this direction was not such a variation as to render the active devices formed in this area unacceptable due to thickness of the deposited oxide layer.

While the variation of deposited oxide, from edge to edge in the direction parallel to the flow of the source gas, and more particularly, in the center of the wafer, does not experience as great a variation as is the variation perpendicular to the gas flow, there is a problem in achieving acceptable thicknesses in this direction. When the decomposed TEOS contacts the first wafer in its path, it tends to form a silicon dioxide layer at the point of first contact. Hence, with a minimum TEOS flow all the material could deposit out of a gas flow before reaching the last wafer in the line. In this manner with an insufficient gas flow, the first wafer would have a greater thickness on its surface, while the last wafer could have no coverage at all. In order to prevent this from happening, a greater gas flow is achieved which pushes the source material to the end of the tube so that the wafer at the exhaust end of the tube is also covered with a thickness comparable with the thickness on the first wafer in the tube. Many factors enter the achievement of this result; namely: the temperature of the source material, the temperature of the furnace, the geometric design of the source bottle, the gas flow through the source material as well as all other geometric dimensions as to pipes, openings, etc.

The prior art teaches increasing of flow of source material to that flow at which the flow down the tube is high enough that the deposited silicon dioxide material forms in the stripe down the central portion of the wafers, as previously discussed.

SUMMARY OF THE INVENTION

The present invention relates, in general, to depositing a layer of material from a gaseous source on a semiconductor wafer at an elevated temperature, and more particularly, it relates to the formation of a silicon dioxide layer on a semiconductor wafer using a TEOS source.

It is an object of the present invention to provide a new method for depositing a silicon dioxide layer on a semiconductor wafer such that the layer is uniform across the surface of the wafer.

It is a still further object of the present invention to provide a method for depositing a silicon dioxide layer on a semiconductor wafer using TEOS as the material source and a greater number of wafers are uniformly covered than was possible using the prior art systems.

It is a further object of the present invention to provide a method for depositing silicon dioxide from TEOS on a plurality of wafers, which wafers are standing on edge, and which wafers are positioned perpendicular to the flow of source material down the tube.

It is another object of the present invention to provide a method for depositing silicon dioxide on a plurality of wafers standing on edge and having their broad major surfaces perpendicular to the flow of the source gas and using a vacuum as a means for pulling the source material through the tube.

It is a still further object of the present invention to provide a method for depositing a silicon dioxide layer on a semiconductor wafer using a predeposition vacuum step for removing impurities from the TEOS source.

It is another object of the present invention to form a silicon dioxide layer on a semiconductor wafer from TEOS using a predeposition vacuum step for removing impurities from a TEOS source in which the impurities arise from the decomposition of the TEOS in the source container during successive periods of non-use.

It is a still further object of the present invention to provide a method for the depositing of a silicon dioxide film on the surface of a semiconductor wafer to achieve a dense and clean deposited oxide film.

BRIEF DESCRIPTION OF THE INVENTION

Figure 1:
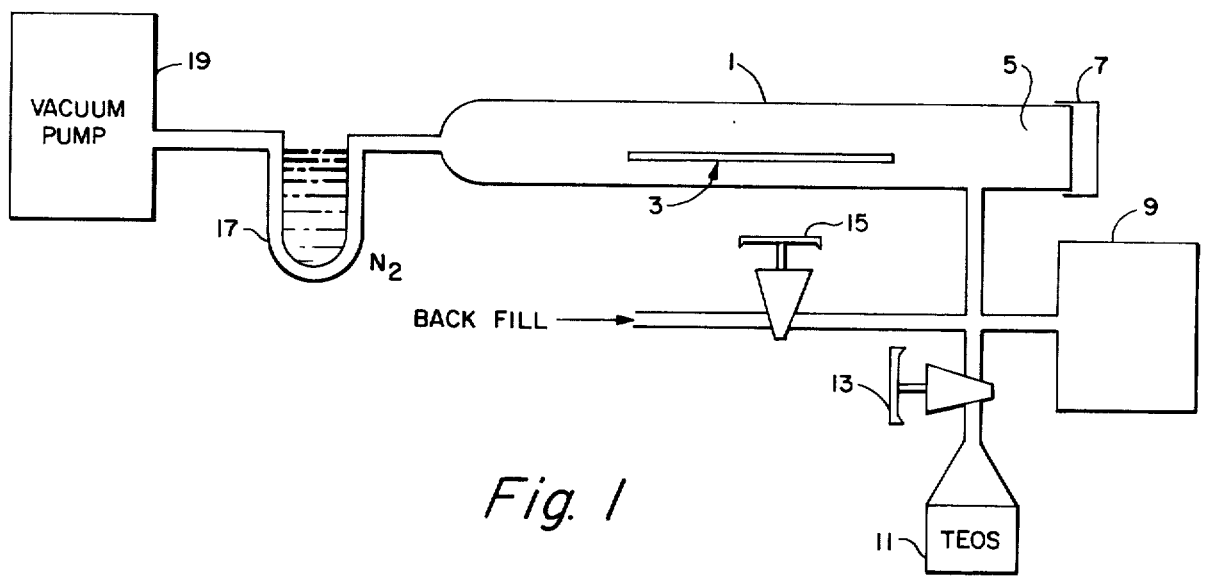
FIG. 1 shows a schematic view of the system for forming a deposited oxide film according to the teaching of the present invention.

The method herein described forms a deposited oxide film on a semiconductor wafer using TEOS as the source of the silicon dioxide. Such a film gives a uniform thickness over the wafer surface for a large number of wafers (100-200) in a single run. The method also achieves a dense oxide film containing fewer impurities and provides a film giving better adherence to a thermal oxide film which could already be in place. This method is not limited to the covering on the substrate nor the substrate itself. These advantages are achieved in part by each new step of the process along as well as in combination with the remaining steps, as is further described hereinafter.

The method is directed at achieving a good flow of source material throughout the entire volume of the tube in which the deposition is made. Such a flow is achieved by using a vacuum as a means for pulling the source material through the tube and using a source container designed for discharging a uniform amount of source material at the desired vacuum level and temperature of operation. A dense deposited oxide film is also achieved by selecting a flow of source material which is balanced between forming a film at a slow rate of growth but yet fast enough as not to be overly long in time.

Factors affecting the flow of gas throughout the system are many and varied. The level of the vacuum established during the deposition run determines how fast the gas flows towards the vacuum. The size of the TEOS surface in the source container is one aspect of the flow of TEOS through the furnace. A larger surface means more TEOS is pulled off. Heating the TEOS means more is pulled off while cooling means less is pulled off. It is thought that the slower the material is pulled off the denser the layer is when formed. The size of the piping orifices all contribute to the amount of material going through the tube. The surface area in the TEOS source container should stay the same during the run. As an example, a ball-shaped bottle would be bad because the surface area starts small, gets larger and then is reduced again as the TEOS is removed from the bottle. A rectangular container of uniform size would be best because the surface area remains the same as when the TEOS is removed. A dense oxide film is achieved by removing impurities from the source material as well as from the wafers and the inside of the tube itself prior to the deposition.

Impurities are removed from the entire system by the use of the predeposition vacuum step by boiling the source material for removing impurities generated by the decomposition of the source material during periods of inactivity. Such a prediffusion vacuum step is also performed whenever a new source bottle is attached to the system for removing the impurities caused by the in situ decomposition of the source material. Such a prediffusion vacuum step is also performed when the source material is let stand idle for any significant period of time; i.e., a matter of hours, such that in situ decomposition occurs and impurities are present in the source bottle.

A variation of this predeposition vacuum step precedes each deposition of deposited oxide. This variation includes the establishment of a vacuum, preferably within the range of 1-2 microns of mercury, for a matter of minutes prior to the deposition of silicon dioxide on wafers contained within the diffusion tube. Such a vacuum is pulled on the tube even before the TEOS enters the tube for removing impurities from every item within the tube. This includes the surface of the wafers, the walls of the tube and even the boat upon which the wafers are placed. This vacuum is established for a matter of minutes prior to the exposing of the TEOS source to the vacuum. Accordingly, the wafers and the tube itself are cleaned by vacuums prior to the oxide film being formed. This step alone practiced before using a prior art system for the formation of a deposited oxide layer improves the density, cleanness and uniformity of such layers formed in the prior art system.

DETAILED DESCRIPTION OF THE FIGURES

Figure 2:
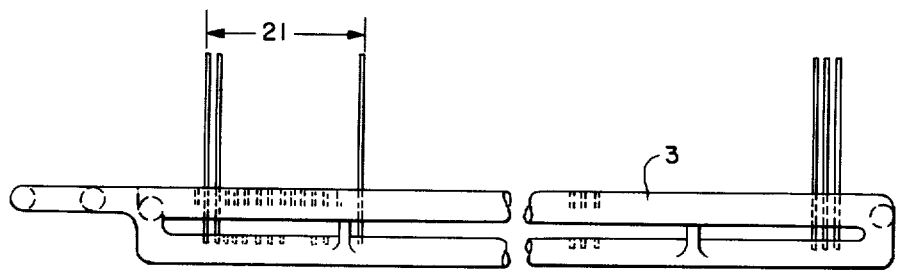
FIG. 2 shows a representative number of wafers carried by a boat in the configuration specially adapted for use in the system of FIG. 1.

Referring to FIGS. 1 and 2, there can be seen a schematic diagram of the system in which the deposition of silicon dioxide from TEOS onto semiconductor wafers is performed. A standard hot wall diffusion tube is shown at 1 and the wafers 2 are shown loaded in a quartz loading boat generally indicated at 3. A more detailed view of the wafers in place in the boat is shown in FIG. 2. The wafers are placed into the tube 1 by way of the source end located generally at 5. An end cap 7 seals the system once the wafers 2 are loaded into the tube 1. A thermocouple gauge control mechanism is shown at 9 whereby the temperature of the diffusion tube is measured. A source of TEOS is indicated at 11 and the source 11 is separated from the diffusion tube by a valve indicated at 13. A valve 15 controls the flow of an inert gas into the diffusion tube, as described hereinafter. A liquid nitrogen cold trap 17 is placed intermediate the tube 1 and a vacuum pump 19. The cold trap removes any TEOS which passes all the way through the tube. An integral part of the vacuum pump, but not specifically shown, is a mechanism for setting the vacuum of the system and a gauge for reading such setting.

Figure 3:
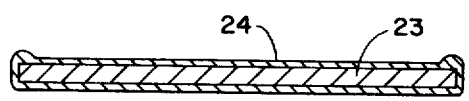
FIG. 3 shows a cross sectional view of a wafer having a halo effect.

Referring to FIG. 2 which shows in greater detail the placement of the wafers in the quartz boat, it should be noted that the wafers are placed on end and are positioned perpendicular to the flow of source material down the tube. The wafers in the boat are placed at a preferred spacing of 200 mils between wafers indicated by the line 21. It can be easily seen that the dimensions in FIG. 2 are grossly exaggerated for clarity. Wafers which are placed 200 mils apart or placed at a greater distance than 200 mils apart have a uniform thickness of the deposited silicon dioxide formed across the surface of the wafer to a tolerance of $\pm 100$ Angstroms. When the wafers are placed closer than 200 mils apart and within the range of 100 mils to 200 mils, as shown in FIG. 3 at 23, a halo effect results in that in a greater amount of silicon dioxide is deposited around the outside rim of the wafer. This deposition at the edge 23 gradually increases from zero at a spacing of 200 mils to a maximum of 500 Angstroms above the surface 24 when the wafers are placed 100 mils apart.

While the halo effect eliminates the edge of the wafer as an area in which devices can be successfully fabricated, its existence does not otherwise hinder the use of the remaining portion of the wafer. Even though the halo effect destroys the edge periphery of the wafer, variation in deposited oxide thickness over the central portion still remains within the variation of $\pm 100$ Angstroms. When the wafers are placed closer than 100 mils apart, the halo effect spreads over other portions of the wafer rendering such wafer not commercially valuable. Accordingly, the preferred range is 200 mils or greater, an acceptable range is 100–200 mils and a commercially unacceptable range is under 100 mils on center. However, even with the very close setting several areas of the wafer are obtained in which operative devices can be built.

Referring again to FIG. 1, the setting on the vacuum pump 19 is established at 10 microns of mercury. It is not unusual that during startup procedures the level of the actual vacuum drops as low as 1 micron of mercury. The temperature of the tube has been selected at 740°C. However, any convenient temperature within the range at which TEOS decomposes and which meets the other normal requirements of sufficiently high deposition rate, and giving a sufficient density, etc. is permissable.

Figure 4:
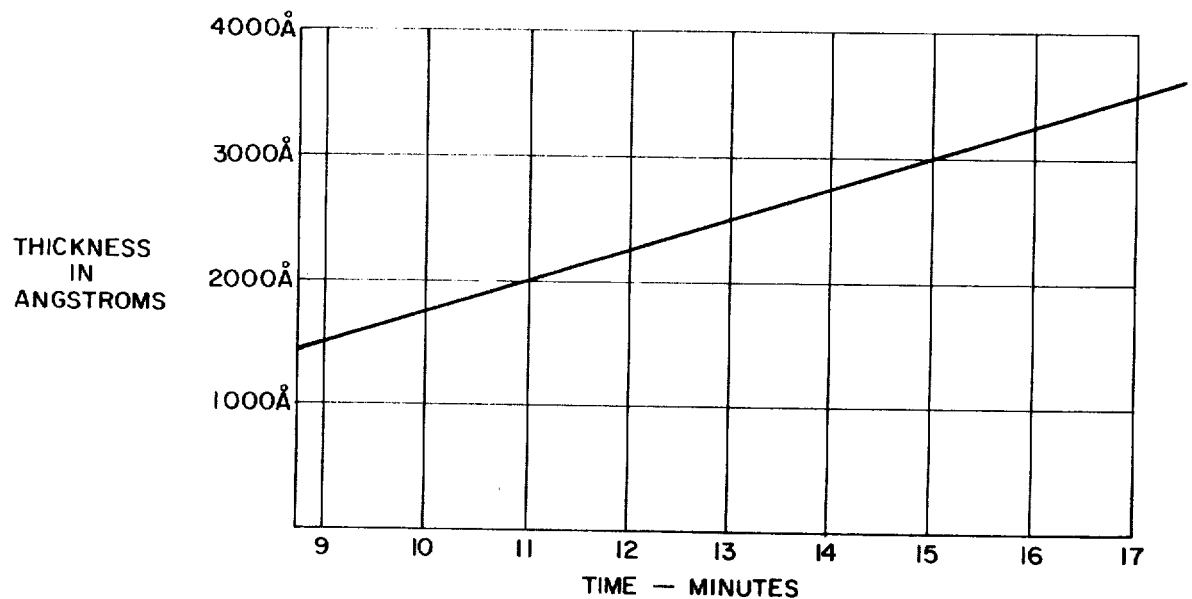
FIG. 4 shows the desposition rate of silicon dioxide from a TEOS source in a vacuum at a temperature of 740°C.

Referring to FIG. 4 there can be seen the deposition rate of the present system for a temperature of 740°C. The deposition is linear in nature and a commercially desirable thickness can be achieved in a relatively short period of time. An entire run can be formed within thirty minutes. Such a run would give a thickness of approximately 3000 Angstroms. While 3000 Angstroms can be grown in approximately 15 minutes, the remaining time is consumed in the raising of the boat and wafers to the operating temperature, establishing the vacuum prior to the deposition step and releasing of the vacuum and cooling the system after the deposition is completed.

Figure 5:
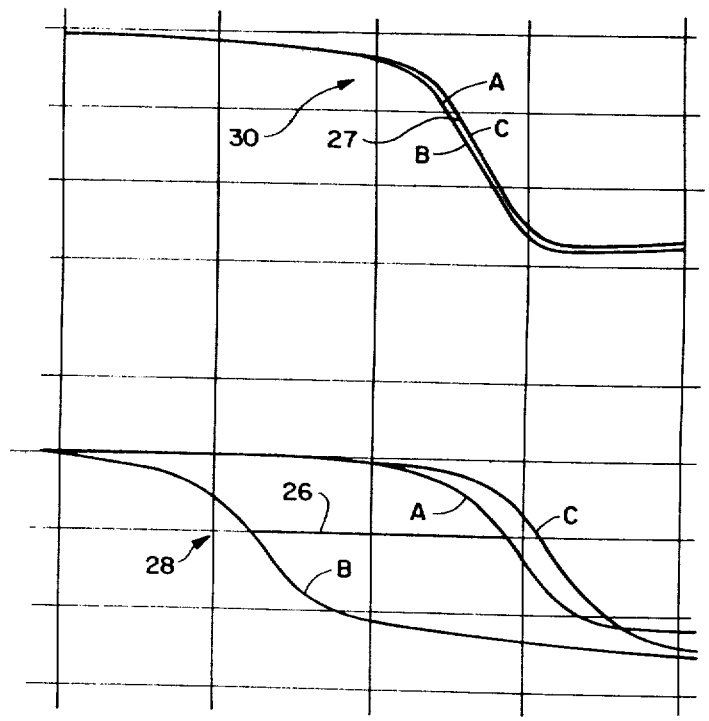
FIG. 5 shows a CV plot showing the improvement between an oxide formed according to the present invention and an oxide formed according to the prior art.

Referring to FIG. 5, there are shown capacitive-voltage curves comparing an oxide film made according to the instant invention with an oxide film made according to the prior art system. By comparing the lengths of lines 26 and 27, the oxide layer made according to the instant invention is ten times cleaner than the other oxide layer. In each of the sets of curves A, B and C, shown in FIG. 5, curve A represents the initial reading after an initial bake at 260°C for one hour. Curve B shows the reading using a plus 30 volt bias while curve C shows the reading with a minus 30 volt bias. In set 28 the length of the line 26 is an indicator of the impurities in the oxide formed by the prior art process. In set 30 the length of the line 27 is an indicator of the impurities in the oxide formed by the present process. This shows that the present process results in the formation of an oxide layer which is at least ten times cleaner.

EXAMPLE 1

The present example gives the step by step operation whenever a new TEOS bottle is selected for use in the deposition of silicon dioxide films on semiconductor wafers. The TEOS bottle 11 is connected in its position shown in FIG. 1. The valve 13 is opened, the end cap 7 is attached in place with no wafers positioned in the tube. The vacuum pump 19 is set at 10 microns and activated. While a vacuum is being established, the source bottle is exposed to the vacuum by the opening of valve 13. The various impurities, ethynol, ether and other hydrocarbons, in the TEOS bottle vaporize at a higher vacuum than the TEOS itself. Accordingly, as the vacuum is being established, the impurities begin to boil off. The vacuum is held at a point higher than that required for vaporizing TEOS but lower than that required for vaporizing the impurities until all the impurities have been removed. These impurities are caught in the liquid nitrogen trap 17. When the visible boiling has ceased, the vacuum is continued for a short period of time to ensure that all impurities have been removed. Then the valve 13 is closed and the valve 15 is opened to break the vacuum and refill the tube 1. This refilling can be either air or an inert gas. The end cap 7 is removed and wafers positioned in their boat are placed in the tube at their position 3. Cap 7 is replaced, and the temperature selected by the controls 9 is established within the tube. While the valve 13 is still closed, the vacuum pump 19 is activated to establish the selected vacuum level. The establishment of this second vacuum prior to the introduction of source material permits the cleaning of the wafer surfaces and the removal of any impurities from within the tube itself. These impurities are caught in the trap 17. The valve 13 is opened allowing the TEOS to vaporize and enter the tube 1. During the deposition run, the vacuum falls to 1000 microns of mercury. This level of vacuum is one measure of the correct flow discussed hereinbefore. Maximum and minimum flow rates have not been established as limits within which the high uniformity of oxide formation is maintained.

Upon completion of the deposition run, the valve 13 is closed, and the vacuum is maintained for several minutes; i.e., 10, to remove all the TEOS from the system. After the ten minute period is over the valve 15 is reopened to break the vacuum, the end cap 7 removed and the vacuum pump turned off. The wafers are withdrawn from the tube and the new quartz boat loaded with wafers is inserted. Since the source material has not been let stand idle for any significant period of time between runs; for example, approaching fifteen minutes, a predeposition vacuum step for removing impurities from the TEOS is not necessary for the second run.

EXAMPLE 2

This sequence of steps would follow immediately after the preceding example whenever the source material has not been allowed to decompose and generate impurities within the TEOS. The wafers are inserted into the tube and the end cap 7 is replaced. The temperature control 9 establishes the temperature at which the deposition occurs and the vacuum pump 19 is activated to pull a vacuum. The establishment of the designated vacuum removes any impurities from the surface of the wafers as well as from the interior surfaces of the tube. After the cleaning period ends, the valve 13 is opened and the TEOS begins to vaporize and be pulled into the tube by the vacuum. The process continues according to the same steps described above and terminates when the desired amount of oxide is formed on the wafers.

While the invention has been particularly shown and described with reference to a preferred embodiment thereof, it will be understood by those skilled in the art that the foregoing and other changes in form and detail may be made therein without departing from the spirit and scope of the invention.

What is claimed is:

1. In a method for depositing a silicon dioxide layer onto a wafer from a gaseous TEOS source flowing through a furnace tube, and the furnace is provided with a means for heating, and is further provided with a first end through which the gaseous TEOS source is admitted into the tube, and is further provided with a second end from which the residual gaseous TEOS material is exhausted, the improvement comprising the steps of:

introducing a plurality of wafers into the furnace through the first end;

placing said plurality of wafers such that the broad surface of each of said wafers upon which the silicon dioxide material is to deposit is placed perpendicular to the direction of the gas flow;

spacing the wafers a minimum of 100 mils between adjacent surfaces;

heating the tube to a temperature for decomposing the TEOS;

exposing said TEOS to the effects of a vacuum for drawing the gaseous TEOS over the wafers while maintaining a vacuum level below 1000 microns of mercury for maintaining an acceptable gas flow through the tube;

continuing the flow of the gaseous TEOS for a predetermined period and then closing off the flow of said gaseous TEOS;

maintaining the vacuum level first established for withdrawing any residual TEOS remaining in the system; and withdrawing said wafers from the furnace by said first end.

2. The method recited in claim 1 wherein the wafers are spaced at a distance greater than 200 mils.

3. The method as recited in claim 1 wherein the wafers are space within a range of 100–200 mils.

4. The method of claim 1 further comprising the step of initially exposing said gaseous TEOS source to a vacuum to vaporize impurities therefrom.

5. The method of claim 1 further comprising the step of establishing a vacuum at the exhaust end of the tube for removing impurities from said wafers prior to introducing the TEOS into the tube.

6. The method of claim 4 further comprising the step of establishing a vacuum at the exhaust end of the tube for removing impurities from said wafers prior to introducing the TEOS into the tube.

* * * * *